United States Patent [19]

Hamada et al.

[11] Patent Number: 5,886,363
[45] Date of Patent: Mar. 23, 1999

[54] SEMICONDUCTOR DEVICE AND PATTERN INCLUDING VARYING TRANSISTOR PATTERNS FOR EVALUATING CHARACTERISTICS

[75] Inventors: Makoto Hamada; Ken Shono, both of Kawasaki, Japan

[73] Assignee: Fujitsu Limited, Kawasaki, Japan

[21] Appl. No.: 964,349

[22] Filed: Nov. 4, 1997

Related U.S. Application Data

[63] Continuation of Ser. No. 405,018, Mar. 16, 1995, abandoned.

[30] Foreign Application Priority Data

Mar. 17, 1994 [JP] Japan .................................. 6-047224

[51] Int. Cl.$^6$ .................................................. H01L 23/58
[52] U.S. Cl. .......................... 257/48; 257/395; 257/401
[58] Field of Search ............................. 257/48, 919, 921, 257/925, 395, 396, 399, 401; 437/8; 438/17

[56] References Cited

U.S. PATENT DOCUMENTS

| | | | |
|---|---|---|---|
| 4,343,877 | 8/1982 | Chiang | 257/48 |
| 4,413,271 | 11/1983 | Gontowski, Jr. et al. | 257/48 |
| 4,672,314 | 6/1987 | Kokkas | 437/8 |
| 4,739,388 | 4/1988 | Packeiser et al. | 257/48 |
| 5,506,441 | 4/1996 | Furuya | 257/925 |

FOREIGN PATENT DOCUMENTS 4-267372  9/1992  Japan ...................... 257/48

*Primary Examiner*—Sara Crane
*Attorney, Agent, or Firm*—Armstrong, Westerman, Hattori, McLeland & Naughton

[57] ABSTRACT

To provide a simulation method capable of efficiently evaluating reliability of gate oxide films formed on the elements within short periods of time to evaluate characteristics of a semiconductor device made up of elements of any size and any number.

In a semiconductor device having transistors formed thereon, a pattern 1 for evaluating characteristics of a semiconductor device characterized in that gate area portions 9, gate bird's-beak portions 10 and LOCOS bird's-beak portions 11, are factors affecting the insulation breakdown of the gate oxide film, are rendered to be variable, so that the shapes of these portions can be handled as independent parameters.

6 Claims, 6 Drawing Sheets

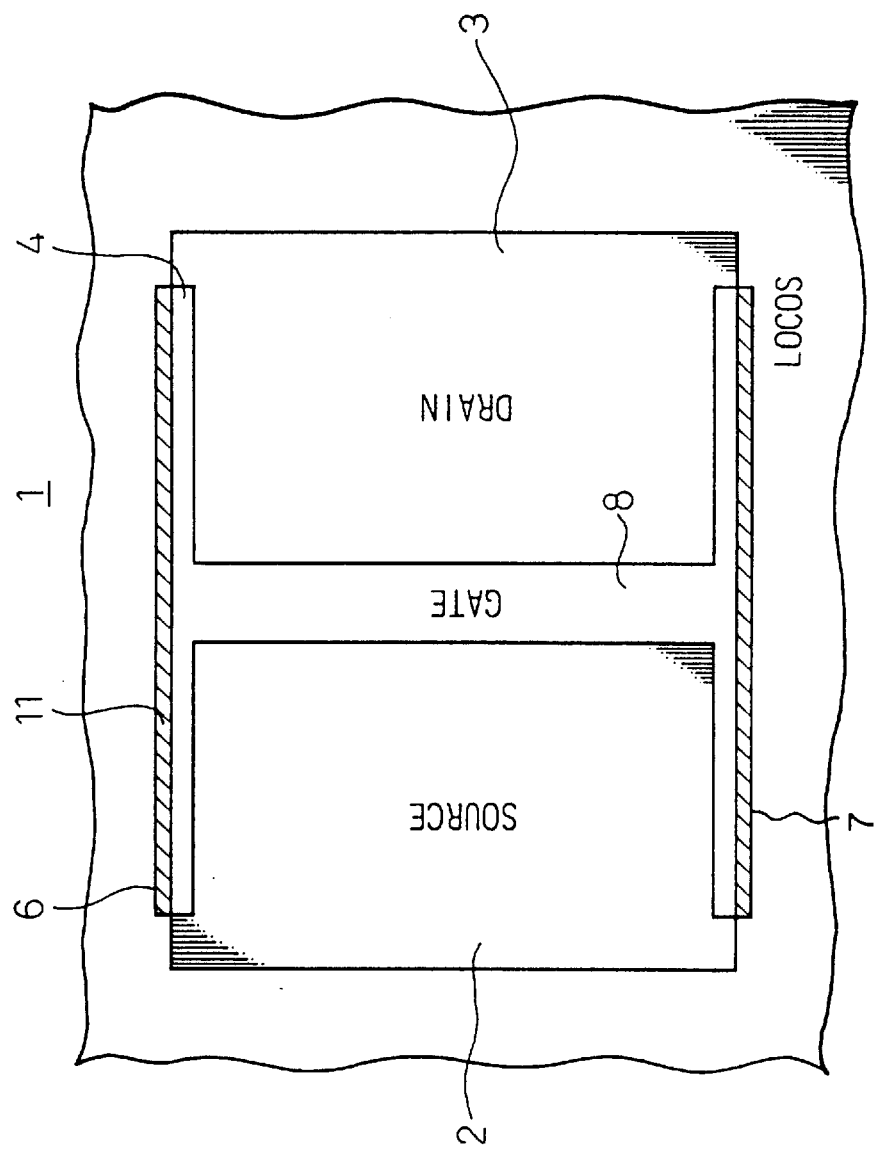

Fig. 3

L₉(3⁴) ORTHOGONAL TABLE

| COL. NO. / No | AREA | GATE · BIRD'S-BEAK | LOCOS · BIRD'S-BEAK | MUTUAL ACTION |
|---|---|---|---|---|
| 1 | 1 | 1 | 1 | 1 |
| 2 | 1 | 2 | 2 | 2 |
| 3 | 1 | 3 | 3 | 3 |
| 4 | 2 | 1 | 2 | 3 |
| 5 | 2 | 2 | 3 | 1 |
| 6 | 2 | 3 | 1 | 2 |
| 7 | 3 | 1 | 3 | 2 |
| 8 | 3 | 2 | 1 | 3 |
| 9 | 3 | 3 | 2 | 1 |

LEVEL
1 → 2 → 3
SMALL ⟶ LARGE

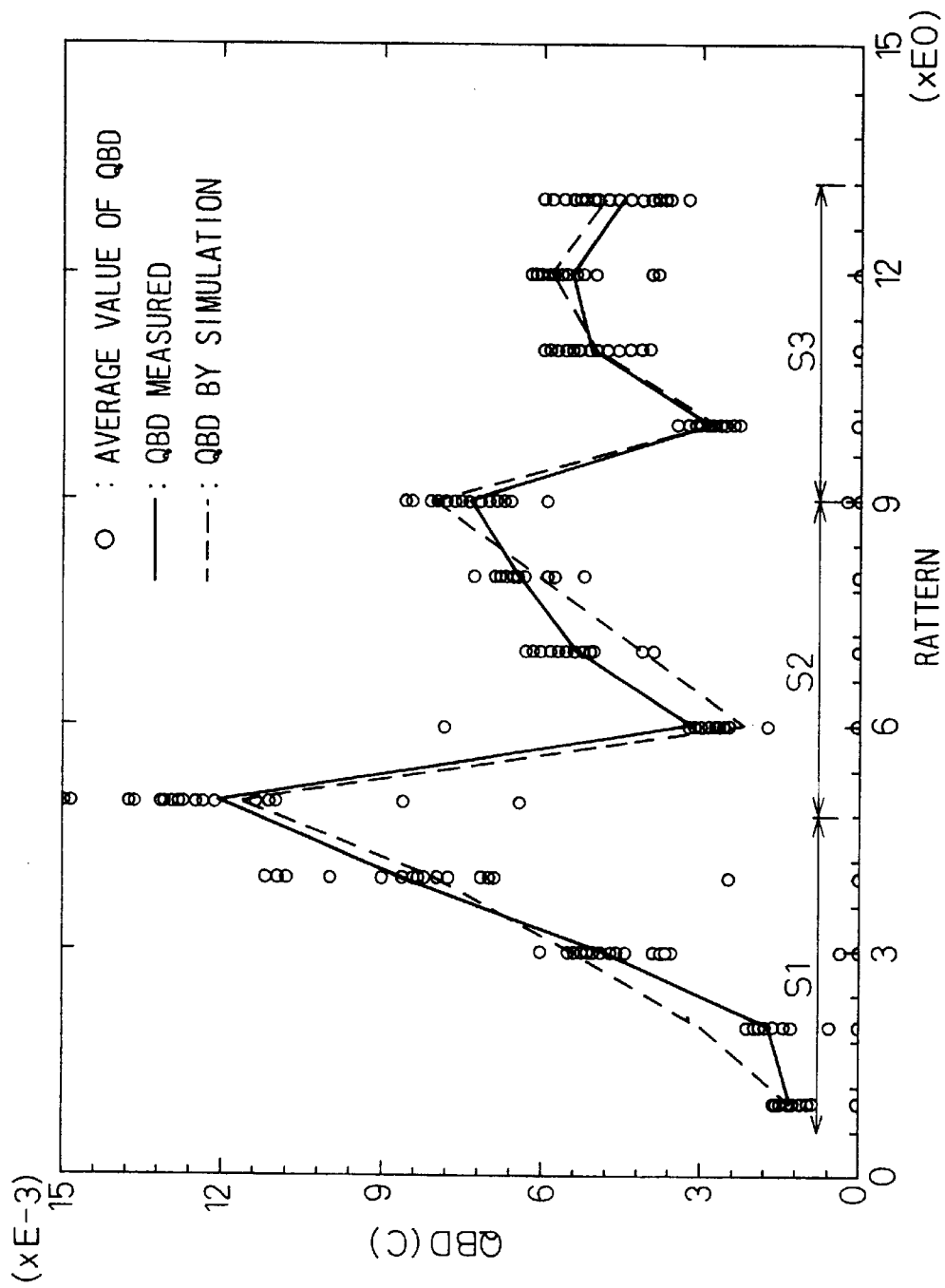

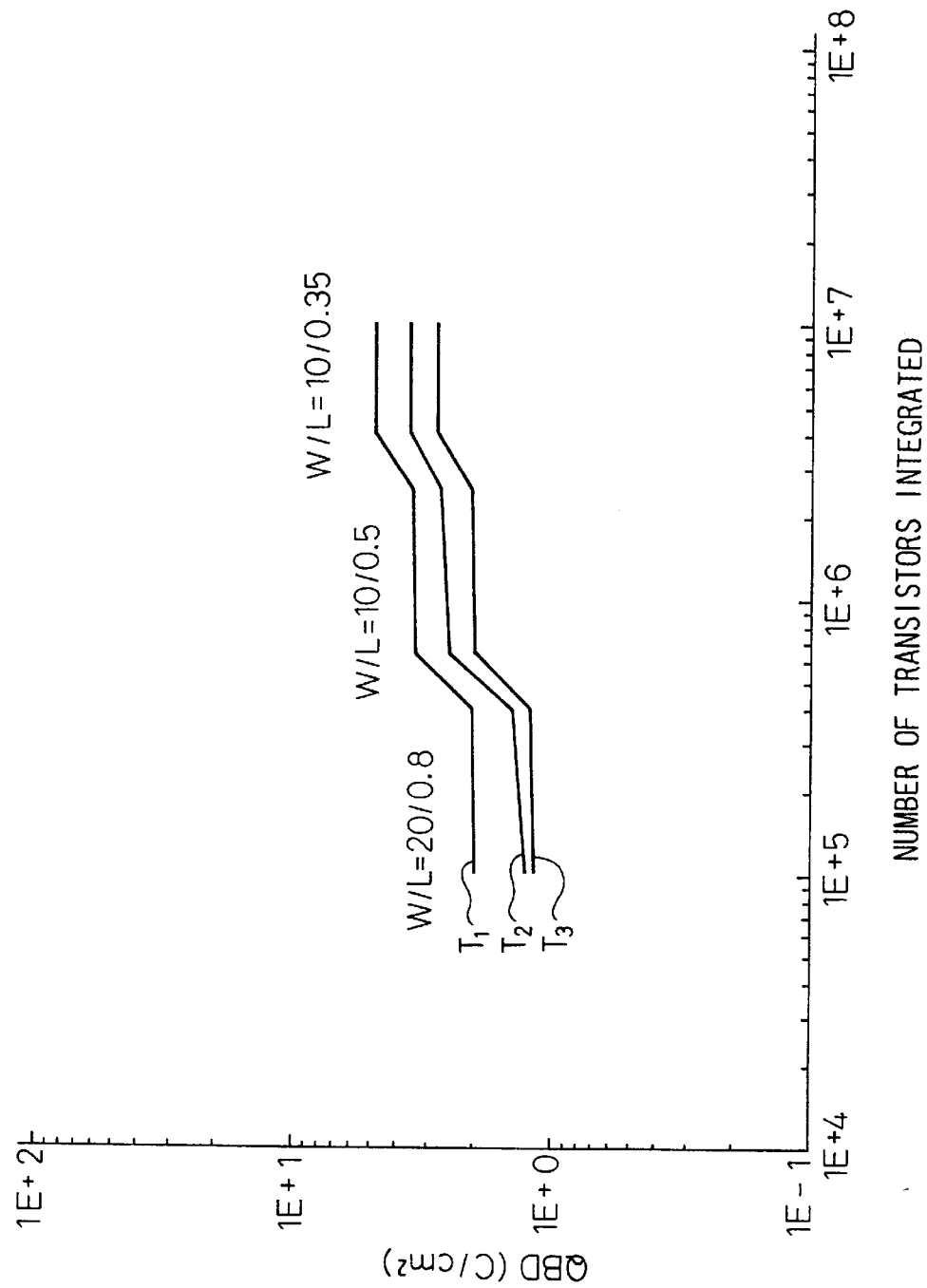

SEMICONDUCTOR DEVICE AND PATTERN INCLUDING VARYING TRANSISTOR PATTERNS FOR EVALUATING CHARACTERISTICS

This application is a continuation of application Ser. No. 08/405,018 filed Mar. 16, 1995, now abandoned.

BACKGROUND OF THE INVENTION

1. Field of the Invention

The present invention relates to a method of evaluating semiconductor devices, a method of designing semiconductor devices and a method of producing the semiconductor devices. More specifically, the invention relates to a method of evaluation for producing semiconductor devices made up of the transistors that exhibit highly reliable characteristics and a method of producing semiconductor devices.

2. Description of the Related Art

Among transistors, a MOS transistor using a gate oxide film has heretofore been widely used. Accompanying the demand for fabricating MOS transistors in reduced sizes yet having improved performance, is a demand to form the gate oxide film with a reduced area and a reduced thickness.

The gate oxide film, however, often undergoes insulation breakdown due to defects in the steps of production, erroneously designing or conditions in which it is used, and it is becoming important to enhance the reliability of the gate oxide film, the properties of the gate oxide film and the life thereof.

In order to improve the reliability of transistor characteristics, therefore, it is necessary to properly evaluate the performance and properties of the gate oxide film.

It is further becoming necessary to investigate the reliability of the gate oxide film of the transistor by evaluating TDDB (time dependent dielectric breakdown) characteristics or QBD (Q-breakdown) characteristics, as an example, to evaluate the quality and characteristics of the semiconductor device for each generation of technology or for each processing technology.

So far, however, the reliability of the gate oxide film has been investigated and evaluated by practically forming an oxide film on a MOS capacitor or the like, relying upon the processing technology that is to be used, and conducting the testing.

Accordingly, problems occur as described below.

(1) An element is formed on which an oxide film is practically formed and the testing is, then, carried out. An extended period of time is required before the test results are obtained.

(2) The testing pattern is made up of an ordinary MOS capacitor which, however, is different in shape from the gate oxide film of the MOSFET. It is not therefore possible to use the data obtained from the MOS capacitor as data for the gate oxide film.

(3) Even when a MOSFET testing pattern is formed as the gate oxide film, a new pattern for evaluation must be formed for every progression of the generation in the LSI.

(4) Reliability of the gate oxide film is affected depending upon its shape, but it is difficult to verify the effects of the shapes in a distinct manner.

So far, therefore, a considerable period of time was required for evaluating the reliability of the gate oxide film that is a basis for evaluating the characteristics of the semiconductor device, i.e., for evaluating characteristics, performance, shape, etc. of the transistor. Besides, it is difficult to evaluate the desired gate oxide film from the obtained data. Moreover, even when the gate oxide film was evaluated, the data were not adapted to evaluating the gate having a different form. Therefore, the evaluation operation had to be repeated for each of the steps for producing transistors and each of the production conditions.

SUMMARY OF THE INVENTION

The object of the present invention is to provide a simulation method capable of efficiently evaluating the reliability of gate oxide films formed on elements, within short periods of time, to evaluate characteristics of a semiconductor device made up of elements of any size and any number, by improving the above-mentioned defects inherent in the prior art.

In order to accomplish the above-mentioned object, the present invention employs a technical constitution that is described below. That is, according to the first aspect of the present invention, there is provided, in a semiconductor device having transistors formed on a substrate, patterns for evaluating the characteristics of a semiconductor device, each pattern comprising a gate portion, a gate bird's-beak portion and a peripheral bird's-beak portion of said transistor, and at least one of said portions of each pattern is different from the same part in another pattern, so that the shapes of said portions can be handled as independent parameters.

According to a second aspect, there is provided a method of evaluating the characteristics of a semiconductor device characterized in that the evaluation is carried out by using a polynomial which includes gate area portions, gate bird's-beak portions and peripheral bird's-beak portions related to transistors that are formed on the substrate of the semiconductor device and in which predetermined coefficients are imparted to the individual parameters. (The peripheral bird's-beak portion is ordinarily indicated as LOCOS bird's-beak portion. "LOCOS" is used instead of "peripheral", hereunder.)

According to a third aspect of the present invention, furthermore, in evaluating the characteristics of a semiconductor device in relation to transistors formed on a substrate of said semiconductor device by using a polynomial which includes gate area portions, gate bird's-beak portions and LOCOS bird's-beak portions of said transistors as parameters and in which predetermined coefficients are imparted to the individual parameters, a method of designing a semiconductor device comprising a step for preparing said plurality of kinds of different patterns for evaluating characteristics; a step for forming predetermined transistors for testing by using said patterns for evaluating characteristics; a step for executing preliminary insulation breakdown testing for said plurality of kinds of transistors for testing that are formed; a step for calculating coefficients of parameters in a polynomial in compliance with a statistical method by substituting evaluation data obtained from said preliminary insulation breakdown testing and the parameters in said testing transistors for said polynomial; a step for subjecting a prototype transistor having predetermined design conditions to the insulation breakdown testing by using said polynomial for which said coefficients are determined; a step for evaluating characteristics of said prototype transistor relying upon the results obtained from said insulation breakdown testing; and a step for changing the constitution of those portions that are likely to undergo insulation breakdown in said prototype transistor relying upon the results of evaluation of characteristics.

By using the above-mentioned pattern for evaluating a semiconductor device of the present invention and by evaluating the characteristics of the semiconductor device by using the evaluation pattern, even a pattern of a gate oxide film that is designed by an experimental planning method but cannot be realized, can be easily formed and evaluated, enabling the evaluation operation to be simplified and correctly evaluated results to be quickly obtained.

By using a predetermined operation formula and by once determining the coefficients of the operation formula, furthermore, the transistors produced under the same production conditions by the same processing technology can be evaluated for their reliability, maintaining a very high accuracy, despite the fact that their shapes are different.

Furthermore, the results of evaluation can be obtained without the need of testing reliability again. Accordingly, the time required for testing the reliability inclusive of forming the samples can be greatly shortened and, as a result, the time for developing a semiconductor device is greatly shortened.

Moreover, the present invention utilizes the results obtained with a practical MOSFET structure. Accordingly, the results of the calculations can be directly adapted to the practical LSIs.

According to the present invention, furthermore, the same reliability testing need not be separately carried out even when the LSI generation has changed or the shape of MOSFET is contracted, and the effect of the shape of MOSFET can be quantitatively evaluated.

BRIEF DESCRIPTION OF THE DRAWINGS

FIG. 1 is a plan view illustrating the shape of a gate pattern for evaluating characteristics according to an embodiment of thee present invention.

FIG. 3 is a diagram of planning for designing samples to be measured according to an experimental planning method employed in the present invention.

FIG. 5 is a graph illustrating the results of reliability testing conducted according to the present invention.

FIG. 6 is a graph showing the results of reliability of particular semiconductor devices found by simulation according to the reliability testing method of the present invention.

DETAILED DESCRIPTION OF THE PREFERRED EMBODIMENT OF THE INVENTION

Figure 2A:
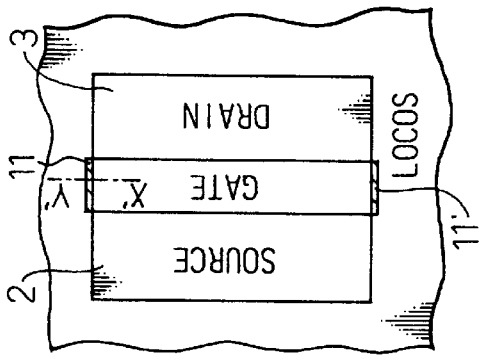
FIGS. 2A to are diagrams illustrating the basic principle for valuating and testing reliability according to the present invention.

Described below, in detail, with reference to the drawings, are a pattern for evaluating the semiconductor device of the present invention, a method of evaluation, a method of designing a semiconductor device and a method of producing a semiconductor device.

FIG. 1 is a diagram illustrating an embodiment of an evaluation pattern for evaluating the reliability of a gate oxide film of a transistor as an example for evaluating the characteristics of a semiconductor device according to the present invention. Specifically speaking, in a semiconductor device having transistors formed on a substrate, a pattern for evaluating the characteristics of a semiconductor device is characterized in that gate area portions, gate bird's-beak portions and LOCOS bird's-beak portions, factors affecting the insulation breakdown of the gate oxide film, are rendered variable, so that the shapes of these portions can be handled as independent parameters.

More concretely, a pattern 1 for evaluating the characteristics according to the present invention is a mask pattern for forming a gate electrode 4 in contact with a source region 2 and a drain region 3 in a suitable transistor portion in a semiconductor device, is constituted by a first belt-like portion 6 and a second belt-like portion 7 that are in parallel with the LOCOS bird's-beak portion, and by a coupling portion 8 which is disposed between said first belt-like portion 6 and said second belt-like portion 7 and couples said first and second belt-like portions 6 and 7 together at right angles.

In the pattern 1 for evaluating the characteristics according to the present invention, a plurality of the above-mentioned patterns each having a different pattern from each other, are prepared and collected.

For example, one gate pattern has the first and second belt-like portions 6 and 7, the lengths in the lengthwise direction of which are different from those of other patterns or one gate pattern has the coupling portion 8, at least a width or length of which is different from counterparts in other patterns.

Furthermore, plural kinds of patterns for evaluating characteristics having different shapes constituted by the aforementioned pattern for evaluating characteristics of the present invention may be arranged on a mask in the form of, for example, a matrix thereby to constitute pattern blocks for evaluating the characteristics.

In the present invention, one gate pattern generating means may be used and, in a mask for forming the above-mentioned gate pattern, a width or a length each one of the portions of the pattern can be variable with a mechanical method controlled by software processing means.

In any embodiment of the present invention, any of the portions of each gate pattern can be changed independently and thus the data obtained from each of the portions of the gate pattern can be handled as independent parameters.

Figure 4:
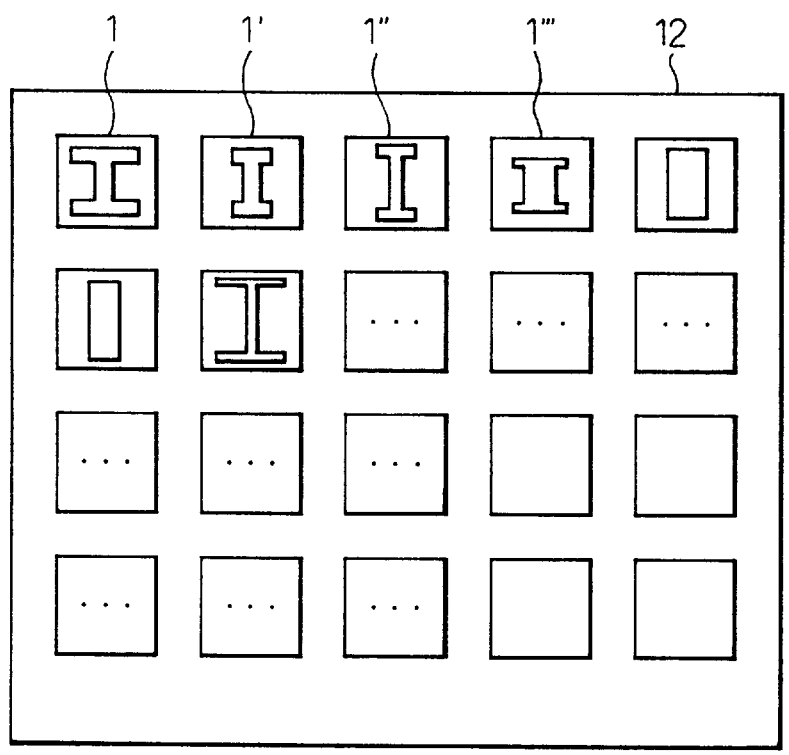
FIG. 4 is a plan view illustrating pattern blocks mounting gate patterns for evaluating characteristics used in the present invention.

Further, in the present invention, some of the selected gate patterns as disclosed in FIG. 4, can be previously provided on a substrate on which a desired semiconductor device should be formed, as a monitor device, so that the evaluating operation as defined by the present invention can be carried out on a chip.

That is, in the method of evaluating characteristics of a semiconductor device according to the present invention, the existing method can be used for testing reliability of a gate oxide film of the transistor, but the method of forming samples such as transistors and the evaluation method employed for testing the reliability are different from the conventional methods of testing reliability.

That is, to test the reliability of, for example, a gate oxide film according to the prior art as described above, a transistor the same as one that is to be subjected to the reliability testing had to be separately formed as a sample. According to the present invention, on the other hand, considerable amounts of evaluation data can be adapted to a practical transistor to evaluate the characteristics as will be described later. Therefore, there is no need of forming samples for individually measuring all of the transistors.

In testing the reliability related to the gate oxide film of the transistor according to the present invention, furthermore, a system is developed as shown in FIG. 2 which makes it possible to separately evaluate the portions of the transistors.

That is, the gate oxide films generally contain defective portions that impair the reliability of the oxide film, and the presence of such defects seriously affect the life of the oxide film of the transistors.

To correctly test the reliability of the gate oxide film, therefore, it is necessary to make sure where in the gate oxide film such defective portions exist. For this purpose, it is necessary to individually and independently observe which portions of the transistors are contributing to evaluating the reliability of the gate oxide film and to what extent.

According to the conventional method, the reliability has been tested while neglecting such a problem. Therefore, the data are not correct. Besides, samples for measurement must be individually prepared for each of the transistors having different constitutions to execute reliability testing.

In order to solve the above-mentioned problems, the present inventors have conducted a thorough study and have realized a model in which portions of the transistors the above-mentioned defects exist as shown in FIG. 2, and have thus made it possible to simulate the reliability of the gate oxide film.

That is, as shown in FIG. 2, the place where the defective portions exist is divided into three kinds for evaluation.

Figure 2B:
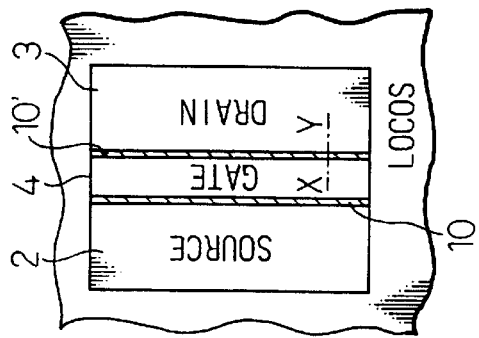
FIG. 2D is a cross sectional view taken along X–Y line of FIG. 2(B) and FIG. 2 ) is a cross sectional view taken along X'–Y' line of FIG. 2(C).
Figure 2C:
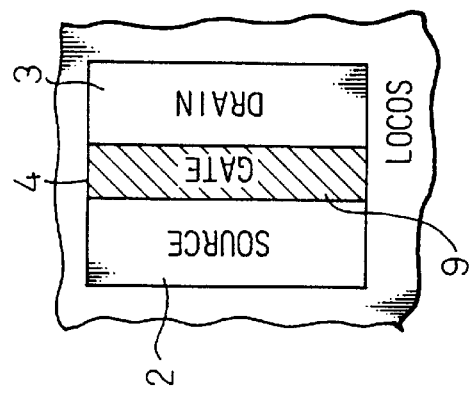
Figure 2D:
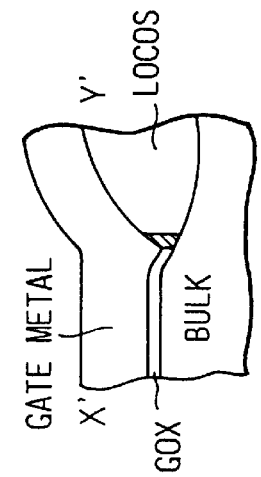
Figure 2E:
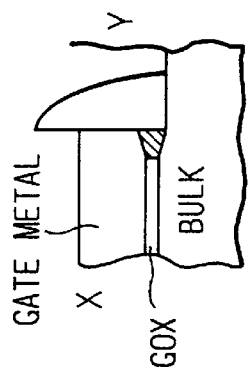

FIG. 2A illustrates a case where many defective portions exist in a portion 9 under the gate, FIG. 2B illustrates a case where many defective portions exist in the portions 10, 10' where the gate, source and drain are overlapped one upon the other, i.e., in the gate bird's-beak portions, and FIG. 2C illustrates a case where many defective portions exist in the portions 11, 11' where the gate and the field oxide film (LOCOS) are overlapped one upon the other, i.e., in the LOCOS bird's-beak portions. FIG. 2D and FIG. 2E show cross-sectional views of FIG. 2B and FIG. 2C, respectively.

The effects at the above-mentioned three portions cannot be separated unless use is made of testing element patterns capable of independently evaluating such three parameters.

In order to analyze the above-mentioned dispersion, furthermore, it is necessary that the individual parameters be independent from one another.

A system using mask patterns having ordinary two-dimensional shapes, as shown in FIG. 2, therefore, cannot cope with a shape that cannot be analyzed and evaluated. In that event, it is obvious that the object of the present invention cannot be accomplished.

In order to accomplish the objects of the present invention by solving the above-mentioned problems, therefore, there is employed a mask pattern for forming a gate having a special constitution as described above.

That is, according to the present invention which uses a pattern for evaluating characteristics adapted to testing the reliability of the gate oxide film, it is possible to correctly judge how the insulating film which is the gate oxide film of the transistors is destroyed, to individually judge the probability of destruction, to judge which portions are likely to be destroyed, and to judge whether the factors leading to destruction are dominant factors or not.

Concretely speaking, when the characteristics of a semiconductor device made up of a plurality of transistors of a given constitution are to be evaluated by testing the reliability of the gate oxide film, the sample that is to be evaluated is, first, prepared by a known experimental designing method.

FIG. 3 is an orthogonal table prepared according to the experimental designing method, which instructs a method of preparing samples in the case when a transistor having a predetermined structure is to be tested for its reliability.

This embodiment employs four kinds of parameters for the above-mentioned three kinds of portions that affect the insulation breakdown of the gate oxide film, i.e., gate area, gate bird's-beak and LOCOS bird's-beak, as well as an item for seeing mutual actions among them, and each of the items has a constitution of three levels that can be changed.

As for the gate bird's-beak, for instance, the parameters are such that 1 has a length of 10 $\mu$m, 2 has a length of 20 $\mu$m, and 3 has a length of 30 $\mu$m.

In this embodiment, it is necessary to prepare nine kinds of test patterns.

That is, the orthogonal table of FIG. 3 shows the combinations of levels of the above-mentioned parameters in each of the patterns.

According to the above-mentioned experimental designing method, many patterns of shapes, that cannot be tested with the ordinary gate shapes must be formed, and the shapes can no longer be handled using conventional mask patterns.

For instance, the samples 1, 4 and 7 in the orthogonal table of FIG. 3 can be prepared even by the conventional method. However, in the case of the sample 3, the gate bird's-beak and the LOCOS bird's-beak are both long despite the fact that the gate area of the sample is small, which is contrary to the shape of the prior art.

However, the pattern for evaluating characteristics of the present invention shown in FIG. 1 makes it possible to easily prepare a predetermined sample shown in the orthogonal table of FIG. 3 by adjusting the lengths of the belt-like portions 6, 7 or the length or width of the coupling portion 8.

That is, with the pattern of the sample 3, an increase in the gate area can be almost neglected despite the fact that the effect of the LOCOS bird's-beak is increased by using the pattern, for evaluating characteristics, of FIG. 1. This makes it possible to prepare a combination of gates in which, for example, the LOCOS bird's-beak is long and the area is small.

According to the present invention, pattern masks for forming gates of their respective patterns indicated by the experimental designing method are formed by using the pattern for evaluating characteristics, and test transistors having predetermined gate shapes are formed.

By using the above-mentioned pattern for evaluating characteristics, furthermore, a mask pattern block 12 is prepared in which plural kinds of patterns having different shapes for evaluating characteristics are constituted in the form of blocks as shown in FIG. 4. Then, the test transistors are formed while suitably and sequentially selecting, out of the mask patterns the patterns for evaluating characteristics that meet the patterns indicated by the experimental designing method.

Described below is a method of estimating reliability by evaluating the characteristics of a predetermined semiconductor device using the pattern for evaluating characteristics of the present invention.

As described above, the reliability of the gate oxide film is affected by defective portions existing in the gate oxide film. Therefore, the reliability of the gate oxide film can be expressed by using the above-mentioned parameters representing defect density in the gate oxide film, gate area, gate bird's-beak and LOCOS bird's-beak.

As an index for evaluating reliability, there can be employed TDDB, i.e., a method of evaluating the time until the gate oxide film undergoes insulation breakdown by applying a predetermined voltage or a predetermined current to the gate oxide film of a transistor of a predetermined constitution as described above, or QBD, i.e., a method of evaluating reliability by continuously passing an electric current into the gate oxide film of a transistor of a predetermined constitution and by finding the total amount of an electric charge accumulated when until the gate oxide film undergoes insulation breakdown.

In order to execute the above-mentioned method, a variety of test samples that are found by the above-mentioned experimental designing method are formed, a testing probe is brought into contact with predetermined electrode of each of the samples to apply a predetermined voltage or a current and, during this period, the voltage applied to the transistor is monitored. When the voltage drops suddenly or when the current that is monitored and is fed to the transistor suddenly increases, it is judged that the gate oxide film underwent insulation breakdown, and the total amount of electric charge applied up to that moment or the time is measured.

The measurement can be taken even for plural kinds of test sample transistors that are formed on a substrate by moving a suitable probe using a suitable control means.

In the present invention, a variety of data obtained by the above-mentioned method are evaluated by using the following formula for evaluation.

The following description deals with the case of evaluating the reliability of the gate oxide film based on the QBD.

That is, QBD represents the total amount of electric charge accumulated the gate portion when the gate oxide film undergoes the insulation breakdown. QBD uses the following polynomial (1) having independent variables, wherein the gate area, gate bird's-beak and LOCOS bird's-beak serving as parameters.

$$QBD = AREA \times \left(A1 + \frac{B1}{AREA^2}\right) + EDGE \times \left(A2 + \frac{B2}{EDGE^2}\right) + OVERLAP \times \left(A3 + \frac{B3}{OVERLAP^2}\right) + C \quad (1)$$

where AREA: gate area,
EDGE: length of gate bird's-beak
OVERLAP: length of LOCOS bird's-beak
A1, A2, A3, B1, B2, B3, C: constants That is, the above polynomial (1) is a combination of parameter portions which will be multiplied and which represents positive effects in the QBD evaluation and a square-power inverse proportional portion which represents negative effects. To the parameter portions, i.e., AREA, EDGE and OVERLAP will be input the total number of parameters of all the transistors of a number of X constituting the semiconductor device that is put to reliability testing.

That is, data of X×channel length×channel width are input to the portion of parameter AREA, the data of X×channel width×2 are input to the portion of EDGE, and the data of X×channel length×2 are input to the portion of OVERLAP.

As for the parameters which are independent variables, reliability is tested by forming test transistors under sufficiently wide conditions in regard to the number of parallel transistors and the shapes of gates by using the pattern for evaluating characteristics of FIG. 1.

After the QBD is measured for all of the test transistors formed by the above-mentioned method, coefficients of the above-mentioned polynomial (1) are found by effecting the statistical processing such as double-regressive analysis.

Once the coefficients in the polynomial are found, the reliability can be tested and can be estimated thereafter by using the same polynomial (1) for the semiconductor devices constituted by transistors such as MOSFETs formed under the same processing conditions despite the fact that the transistors have different shapes, sizes and numbers.

By using the above-mentioned pattern for evaluating characteristics of the invention, and by using the method of evaluating characteristics, and by finding predetermined coefficients in the polynomial, the following advantages are obtained, i.e., (1) since there is no need of testing the reliability again, the sample need not be formed and no time is required for testing the reliability, enabling the time required for developing a semiconductor device to be shortened, (2) in the evaluation method of the present invention, the reliability of the practical transistor such as MOSFET is evaluated and, hence, the results of the operation can be directly applied to the practical LSI and the like, (3) the results can be directly applied to the transistors formed under the same processing condition even if the transistors have different shapes and structures, (4) even when the LSIs generation has changed the reliability of the semiconductor devices of two to three generations ahead can be evaluated, and the reliability need not be tested even when the size of the transistors are reduced, (5) the effects of the shapes of MOSFETs can be quantitatively evaluated, and (6) the parameters in the polynomial can be applied not only to the QBD but also to all of the parameters, related to reliability, of the gate oxide film.

FIG. 5 illustrates the results of when a semiconductor device having particular transistor structures is tested for its reliability by using the pattern for evaluating characteristics of the present invention and by further using the above-mentioned polynomial for testing and evaluating reliability.

In FIG. 5, the abscissa represents the kinds of transistors formed on the semiconductor device. The gate width W of the transistor is successively increased in a region S1, the channel length L of the transistor is successively increased in a region S2, and the pattern for evaluating characteristics shown in FIG. 1 is changed in a variety of ways in a region S3.

The ordinate represents the QBD values in the above-mentioned test of reliability. In FIG. 5, open circles represent QBD values that were practically measured and solid lines represent average QBD values that were practically measured.

Dotted lines represent results found by simulating the QBD values of the same transistor by calculating the coefficients of the polynomial (1) based upon the QBD values represented by open circles and by using the polynomial (1) for which the coefficients are substituted. As will be obvious from these results, the pattern for evaluating characteristics of the present invention and the polynomial (1) for evaluating characteristics are very close to the results of practical measurement, and can be put into practical use to a sufficient degree.

Discussed below is the case of practically designing a semiconductor device or producing the semiconductor device using the method of evaluating characteristics according to the present invention.

FIG. 6 shows the results of evaluating the characteristics and reliability of a semiconductor device containing transistors fabricated under the same processing conditions as during the testing for reliability, found by a simulation using the polynomial (1) for which the coefficients were found by the above-mentioned method.

In FIG. 6, the ordinate represents QBD values and the abscissa represents the number of transistors arranged on the semiconductor device.

Furthermore, the graphs of FIG. 6 represent the cases where the size of the transistor, e.g., W/L is changed and the thickness of the gate oxide film of the transistor is changed.

That is, the graphs T1 to T3 represent transistors that are formed by changing the thickness of the gate oxide film and wherein the transistor size decreases and the degree of integration increases from the left to the right in the graphs.

The graphs T1 to T3 further represent examples where the transistor constitution is changed, i.e., W/L is changed in three stages.

It will be understood from the above results that when the transistor size decreases, the QBD value greatly changes being affected by the channel length, i.e., being affected by the length of the LOCOS bird's-beak. When a next generation LSI is to be fabricated, therefore, the problem may occur in the reliability of the LOCOS bird's-beak length. It can therefore be recommended to improve oxide film characteristics by improving the shape of the LOCOS bird's-beak or by changing the W/L ratio and, besides, design of the transistor can be so changed as to meet the recommendation.

Transistors in the above-mentioned semiconductor device can be designed by utilizing the method of evaluating characteristics of the semiconductor device of the present invention. Described below is a suitable method of designing.

That is, in evaluating characteristics of a semiconductor device in relation to transistors formed on a substrate of said semiconductor device by using a polynomial which includes gate area portions of said transistors, gate bird's-beak portions and LOCUS bird's-beak portions as parameters and in which predetermined coefficients are imparted to the individual parameters, a method of designing a semiconductor device comprises a step for preparing said plurality kinds of different patterns for evaluating characteristics; a step for forming predetermined transistors for testing by using said patterns for evaluating characteristics; a step for executing preliminary insulation breakdown testing for said plurality kinds of transistors for testing that are formed; a step for calculating coefficients of parameters in a polynomial in compliance with a statistical method by substituting evaluation data obtained by said preliminary insulation breakdown testing and the parameters in said test transistors for said polynomial; a step for subjecting a prototype transistor having predetermined design conditions to the insulation breakdown testing by using said polynomial for which said coefficients are determined; a step for evaluating characteristics of said prototype transistor relying upon the results obtained by said insulation breakdown testing; and a step for changing the constitution of these portions that are likely to undergo insulation breakdown in said prototype transistor relying upon the results of evaluation of characteristics.

By utilizing the above-mentioned designing method, a predetermined semiconductor device can be easily produced.

The second embodiment of the present invention will be explained hereunder.

As shown in the Table 1, three different conditions used in the process for making oxide films, were selected and three different kinds of semiconductor devices were produced.

Thereafter, the reliability of these oxide films were checked in accordance with the evaluation method as defined by the present invention.

The results thus obtained are indicated in Table 1.

The three samples of the semiconductor devices No. 1 to No. 3 are formed each one of the evaluation gate patterns as shown in FIG. 4, utilizing each of the process conditions as indicated in Table 1, respectively.

Then, the value of QBD of each oxide film of the respective samples No. 1 to No. 3 were measured to thereby calculate each of the coefficients A1, A2. . . B2, B3, and C for each one of the samples No. 1 to No. 3.

Thereafter, a value of the QBD of an integrated transistor circuit device, each one of the transistors having a width W=10 $\mu$m and a length L=0.35 $\mu$m, with an integrating ratio of $1\times10^6$, was obtained by simulating with the equation (1) of the present invention, for each one of the three samples. As apparent from Table 1, the value of QBD can be increased when the amount of value concerning the sacrificed oxidation is increased.

Therefore, it is apparent that the sample No. 3 obtained under the process condition in which the amount of value concerning the sacrificial oxidation is 15 nm, has the maximum value of QBD, and has the most superior oxide film.

On the other hand, when the same result as mentioned above, is desired to be obtained without utilizing the evaluation as defined by the present invention, first, a plurality of test patterns for transistors, the number of which is $1\times10^6$, and each having a width W=10 $\mu$m and a length L=0.35 $\mu$m, respectively, are parallely arranged, is prepared.

Then, samples of the semiconductor devices should actually be made utilizing each one of the patterns, and thereafter, the value of QBD for each one of the samples should be measured.

Accordingly, in the conventional method, the measuring operation as mentioned above needs extremely long time and is a very complicated process.

However, in the present invention, only one test pattern is used and the simulation for the reliability of the gate oxide film of various kinds of transistor utilizing the equation (1) with optionally changing the size of transistors and the integration ratio.

TABLE 1

| | Processing Condition Sacrificed oxidation value (nm) | Measured value QBD (C/cm$^2$) |
|---|---|---|
| Sample 1 | 5 | 0.365 |
| Sample 2 | 10 | 0.602 |
| Sample 3 | 15 | 2.82 |

By employing the above-mentioned technical constitution, the present invention prepares a pattern for evaluation and testing, analyzes the measured results using the above-mentioned polynomial, and simulates the reliability of the gate oxide film of next generation LSIs.

Therefore, the time for evaluating the reliability is shortened and, besides, there is no need of forming many elements for evaluating the oxide film, contributing greatly to developing semiconductor devices.

By using the pattern for evaluating the semiconductor device of the present invention and by evaluating characteristics of the semiconductor device using the above-mentioned pattern for evaluation, furthermore, even a pattern of a gate that cannot be realized as indicated by the experimental designing method, can be easily formed and evaluated. Therefore, the evaluation operation is simplified and correctly evaluated results are quickly obtained.

Moreover, by using a predetermined operation formula and by once fixing coefficients of the operation formula, the transistors fabricated under the same production conditions and by the same processing technology can be evaluated for their reliability maintaining very high accuracy despite differences in their shapes.

The results of evaluation are obtained without the need of testing again the reliability, the time required for testing the reliability inclusive of forming the samples is greatly shortened, and the time for developing semiconductor devices is greatly shortened.

We claim:

1. A semiconductor device comprising: transistors formed on a substrate, each transistor including a pattern for evaluating reliability characteristics of a semiconductor device, each pattern having first, second, and third elements, wherein said first element is a gate electrode area, said second element is a gate bird's-beak and said third element is a peripheral bird's-beak, wherein at least one of said first, second, and third elements has a different size in patterns of first and second transistors and at least one of said first, second, and third elements has substantially the same size in said patterns of said first and second transistors, so that the shapes of said portions can be handled as independent parameters.

2. A semiconductor device according to claim 1, wherein said patterns for evaluating characteristics, are formed by a set of a plurality of patterns for evaluating characteristics, each pattern being different from every other pattern.

3. Patterns for evaluating characteristics of a semiconductor device as set forth in claim 1, wherein the shape of said first element, being a gate electrode area, is constituted by a first belt-like portion and a second belt-like portion that are in parallel with the peripheral bird's-beak portion, and by a coupling portion which is disposed between said first belt-like portion and said second belt-like portion and is coupled to said first and second belt-like portions together at right angles with said first and second belt-like portions.

4. Patterns for evaluating characteristics of a semiconductor device according to claim 3, wherein a length in the lengthwise direction of said first and second belt-like portions in one gate electrode area are different from those of other gate electrode areas, and at least a length in the lengthwise direction of said coupling portion of one gate electrode area is different from other gate electrode areas.

5. Patterns for evaluating characteristics of a semiconductor device according to claim 3, wherein a length in the lengthwise direction of said first and second beltlike portions in one gate electrode area are different from those of other gate electrode areas, and at least a length in the direction in parallel with said belt-like portions of one gate electrode area is different from other gate electrode areas.

6. A semiconductor device according to claim 1, wherein said first element has substantially the same size in said patterns of said first and second transistors.

* * * * *